INVENTOR
E. H. COOKE-YARBOROUGH
BY R. B. Ardis
ATTORNEY 3,360,739
STABILIZIED DUAL-CHANNEL PULSE AMPLIFIERS WITH TRANSIENT RESPONSE COMPENSATION Edmund H. Cooke-Yarborough, Murray Hill, N.J., assignor to Bell Telephone Laboratories, Incorporated, New York, N.Y., a corporation of New York Filed June 10, 1965, Ser. No. 462,869
2 Claims. (Cl. 330—124)

ABSTRACT OF THE DISCLOSURE

A dual channel pulse amplifier wherein each path from the input to output contains an amplifier having a net signal phase reversal, one being a main amplifier and the other a secondary amplifier, with a cross-coupling attenuator connected between paths from the output side of the main amplifier to the input side of the secondary amplifier. Passive compensation is employed to equalize the phase delay over the several transmission paths. In one arrangement a phase delay element is added both in the direct path between the main amplifier and the output and in the direct path between the secondary amplifier and the input, where each of the delay elements is respectively equal to the delay of the amplifier in the other transmission path. In another arrangement a single compensator is connected in circuit with the cross coupling attenuator to provide a phase advance substantially equal to the phase delays common to the main and secondary amplifiers.

Figure 1:
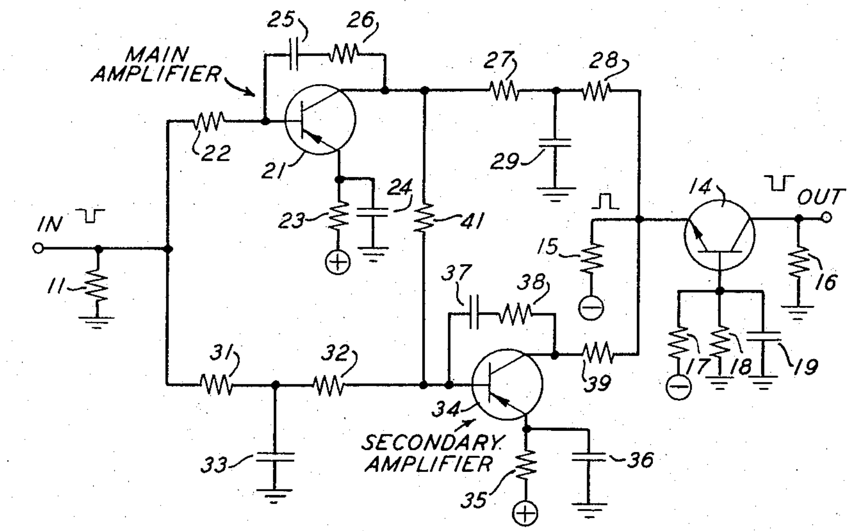

This invention relates generally to pulse amplifiers and more particularly to pulse amplifiers which are required to have extremely short rise and fall times.

One object of the invention is to stabilize the rise and fall times of a pulse amplifier against changes in active element response characteristics.

Another and more particular object is to stabilize the rise and fall times of a pulse amplifier without slowing them to any significant extent.

The tool most frequently employed for stabilizing the gain of an amplifier against changes in the response characteristics of its active elements is negative feedback. Feedback is less effective, however, for stabilizing the rise and fall times of a pulse amplifier. If the feedback is independent of frequency, the rise and fall times of the amplifier vary with the high frequency characteristics of the active elements. If, on the other hand, the feedback is made to increase with frequency, stability of rise and fall times is achieved but at the expense of a considerable reduction in speed.

A different type of amplifier which has been known for many years to provide gain stability is the dual channel amplifier disclosed in U.S. Patent 1,686,792, which issued Oct. 9, 1928, to H. S. Black. That amplifier is made up of an input section, an output section, a path from the input section to the output section containing a main amplifier having a net signal phase reversal, a path from the input section to the output section containing a secondary amplifier having a net signal phase reversal, and a cross-coupling attenuator connected between paths from the output side of the main amplifier to the input side of the secondary amplifier. Such an amplifier is advantageous not only in that its gain is insensitive to changes in the gains of the component amplifiers but also in that it will continue to function with either component amplifier out of action entirely.

The present invention stabilizes the rise and fall times of a dual channel pulse amplifier of the type described against changes in the high frequency characteristics of the active elements in the component amplifiers with no significant loss of speed. In accordance with the invention, passive compensation is employed to equalize the phase delays between the dual channel amplifier input and output sections over the several transmission paths that are involved. In one important embodiment of the invention, one compensator is connected in the direct path between the amplifier input section and the secondary amplifier and has a signal phase delay substantially equal to the signal phase delay of the main amplifier, while another is connected in the direct path between the output side of the main amplifier and the output section of the dual channel amplifier and has a signal phase delay substantially equal to the signal phase delay of the secondary amplifier. In another, a single compensator is connected in circuit with the cross-coupling attenuator and has a signal phase advance substantially equal to the signal phase delays common to the main and secondary amplifiers. The two compensation methods may with advantage be combined.

Figure 2:
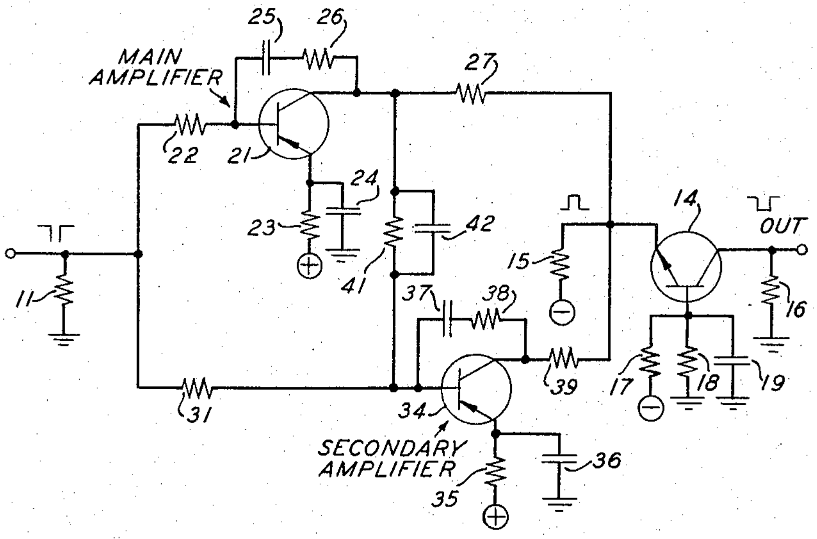

A more complete understanding of the invention may be obtained from a study of the following detailed description of several specific embodiments. In the drawing:

FIG. 1 is a schematic diagram of an embodiment of the invention in the form of a dual channel pulse amplifier employing separate compensating networks for the main and secondary amplifiers; and FIG. 2 is a schematic diagram of an alternative embodiment of the invention employing a single compensator for both main and secondary amplifiers.

The input section of the dual channel amplifier illustrated in FIG. 1 is simply a shunt resistor 11 connected, for biasing purposes, from the amplifier input terminal to ground. The output section is a common-base transistor amplifier formed by an n-p-n transistor 14 and its associated biasing circuits. As illustrated, the emitter of transistor 14 is returned to a negative direct voltage source through a resistor 15 and the collector is returned to ground through a resistor 16. The base of transistor 14 is connected to an intermediate fixed potential which may, by way of example, be established by a voltage divider made up of a pair of resistors 17 and 18. Resistor 17 is connected from the base to the same negative voltage source as emitter resistor 15 and resistor 18 is connected from the base to ground. A by-pass capacitor 19 is also connected from the base of transistor 14 to ground.

There are two parallel channels between the input section and the output section of the dual channel amplifier illustrated in FIG. 1, one containing a main amplifier and the other containing a secondary amplifier. In the upper channel, the main amplifier is a common-emitter transistor amplifier with negative feedback. It includes p-n-p transistor 21 which has its base connected to receive incoming signals from the input section through a resistor 22. The emitter of transistor 21 is connected to a positive direct voltage source through a resistor 23 and is bypassed to ground by a capacitor 24. Negative feedback is provided by a blocking capacitor 25 and a resistor 26 connected in series between the collector and the base electrodes of transistor 21. The collector of transistor 21 is connected through a passive compensating network, made up of a pair of series resistors 27 and 28 and a shunt capacitor 29, to the output section at the emitter electrode of transistor 14.

In the lower channel in FIG. 1, the secondary amplifier is a common-emitter transistor amplifier with negative feedback and is substantially identical to the main amplifier. It receives signal energy directly from the input section through a passive compensating network, made up of a pair of series resistors 31 and 32 and a shunt capacitor 33, and include a p-n-p transistor 34 which has its base connected to the output side of the compensating network. The emitter of transistor 34 is returned to the same positive direct voltage source as the emitter of main amplifier transistor 21 through a resistor 35 and is by-passed to ground by a capacitor 36. Negative feedback is provided by a blocking capacitor 37 and a resistor 38 connected in series between the collector and base electrodes of transistor 34. The collector of transistor 34 is connected through a resistor 39 to the dual amplifier output section at the emitter electrode of transistor 14. Finally, a cross-coupled attenuating resistor 41 is connected from the collector of main amplifier transistor 21 to the base of secondary amplifier transistor 34.

In the dual channel amplifier shown in FIG. 1, the nominal gains of the two amplifiers are equal and the transmission response of attenuating resistor 41 is substantially equal to the reciprocal of the nominal gain of each amplifier. In operation, if the gain of the main amplifier differs from its nominal value, a signal appears at the input side of the secondary amplifier and, after amplification, corrects the output signal. This correcting signal is itself subject to any amplification error in the secondary amplifier but, as long as it is small, small errors in the correcting signal have only a second order effect on the magnitude of output signal. The basic dual channel configuration thus operates to stabilize the gain of the circuit as a whole against changes in the gains of the component amplifiers.

Without the two compensating networks, the dual channel amplifier illustrated in FIG. 1 is found to have a transient response overshoot of the order of 13.5 percent. This overshoot takes place because the signal reaching the secondary amplifier by way of the attenuator is delayed by the main amplifier. The resulting transient erorr signal is further delayed by the secondary amplifier, causing it to arrive at the output section of the dual amplifier too late to correct the slow rise of the signal received from the main amplifier. An important disadvantage of this behavior is that during the rise and fall of the signal pulse both component amplifiers contribute to the output and the rise and fall time there are directly affected by any change in the charactateristics of either amplifier.

In the embodiment of the invention illustrated in FIG. 1, rise and fall time stabilization is provided by the two passive compensating networks. The compensating network in the lower channel, made up of series resistors 31 and 32 and shunt capacitor 33, has a signal phase delay substantially equal to the signal phase delay of the main amplifier. The signal reaching the input of the secondary amplifier from the direct path through the compensating network therefore arrives at the same time as that coming through the main amplifier and attenuating resistor 41. Overshoot at the input of the secondary amplifier is thus eliminated. The compensating network in the upper channel, made up of series resistors 27 and 28 and shunt capacitor 29, has a signal phase delay substantially equal to the signal phase delay of the secondary amplifier. The correcting signal from the secondary amplifier thus reaches the output section of the dual channel amplifier simultaneously with the signal from the output of the main amplifier. Calculation shows that the rise and fall times of the whole system in response to a stop input are determined mainly by the constants of the compensating networks, and only to a minor extent by the individual amplifiers. A very high order of rise and fall time stabilization is thereby achieved at the cost of only a relatively slight amount of response speed.

In the embodiment of the invention illustrated in FIG. 1 it has been found that a 25 percent variation in transistor rise time in either of the two component amplifiers causes the output signal in response to a step amplifier input signal to differ from its nominal value by less than 1 percent of its final value. The system rise time between 10 percent and 90 percent of full amplitude is found to be only about 60 percent slower than that of a single amplifier, a relatively insignificant loss of speed when it is considered that a simple negative feedback amplifier having comparable rise time stability would be 9 times slower.

Even the 60 percent slowing of signal pulse rise and fall times is substantially eliminated in the alternative embodiment of the invention illustrated in FIG. 2. The dual channel amplifier there is like the dual channel amplifier shown in FIG. 1 except that, instead of having a compensating network in each channel, it has a single compensator in circuit with the cross-coupling attenuator.

In the embodiment of the invention illustrated in FIG. 2, a compensating capacitor 42 is connected in parallel with attenuating resistor 41 and provides an additional path between the output of the main amplifier and the input of the secondary amplifier. Capacitor 42 provides a signal phase advance substantially equal to the signal phase delays common to the main and secondary amplifiers, thus insuring that corresponding signals from the secondary amplifier arrive at the output section of the dual channel amplifier substantially simultaneously with the direct signals through the main amplifier. The rise and fall time stabilization achieved is slightly less than that obtained by the embodiment of the invention shown in FIG. 1, but the speed of response is greater. A combination of the arrangements of FIGS. 1 and 2 would combine the virtues of both arrangements.

Although the above described arrangements are illustrative of the application of the principles of the invention, it is to be understood that numerous other arrangements may be devised by those skilled in the art without departing from the spirit and scope of the invention.

What is claimed is:

1. A stabilized dual channel signal amplifier which comprises an input section, an output section, first and second parallel channels each extending between said input section and said output section, said first channel containing a main amplifier having a net phase reversal and said second channel containing a secondary amplifier having a net phase reversal, a cross-coupling attenuator connecting the output side of said main amplifier to the input side of said secondary amplifier, and a passive compensator connected in circuit with said attenuator between the output side of said main amplifier and the input side of said secondary amplifier, said compensator having a signal phase advance substantially equal to the signal phase delays common to said main and secondary amplifiers.

2. A stabilized dual channel signal amplifier in accordance with claim 1 in which the gains of said main and secondary amplifiers are substantially equal and the transmission response of said attenuator is substantially equal to the reciprocal of the gains of said main and secondary amplifiers.

References Cited

FOREIGN PATENTS 1,085,194 7/1960 Germany.

ROY LAKE, *Primary Examiner.*

J. B. MULLINS, *Assistant Examiner.*